(12) United States Patent
England et al.

(10) Patent No.: US 7,935,942 B2
(45) Date of Patent: May 3, 2011

(54) TECHNIQUE FOR LOW-TEMPERATURE ION IMPLANTATION

(75) Inventors: Jonathan England, Horsham (GB);
Steven R. Walther, Andover, MA (US);
Richard S. Muka, Topsfield, MA (US);
Julian Blake, Gloucester, MA (US);
Paul J. Murphy, Reading, MA (US);
Reuel B. Liebert, Peabody, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 929 days.

(21) Appl. No.: 11/504,367

(22) Filed: Aug. 15, 2006

(65) Prior Publication Data

US 2008/0044938 A1    Feb. 21, 2008

(51) Int. Cl.
*H01J 37/00* (2006.01)

(52) U.S. Cl. ............. 250/492.21; 250/492.1; 250/492.2; 250/492.3; 250/443.1; 118/723 CB; 118/723 FI

(58) Field of Classification Search ............... 250/492.1, 250/492.2, 492.21, 492.3, 443.1; 118/723 CB, 118/723 FI
See application file for complete search history.

(56) References Cited

U.S. PATENT DOCUMENTS

| | | | | |
|---|---|---|---|---|
| 5,134,301 A | * | 7/1992 | Kamata et al. | 250/492.2 |
| 6,025,602 A | * | 2/2000 | Rose et al. | 250/492.21 |
| 6,084,240 A | * | 7/2000 | Lin et al. | 250/443.1 |
| 6,891,610 B2 | | 5/2005 | Nikoonahad et al. | |
| 7,132,673 B2 | * | 11/2006 | Fischione et al. | 250/492.3 |
| 2002/0093648 A1 | * | 7/2002 | Nikoonahad et al. | 356/237.1 |
| 2003/0029833 A1 | * | 2/2003 | Johnson | 216/58 |
| 2006/0163490 A1 | * | 7/2006 | Tang et al. | 250/443.1 |
| 2008/0076194 A1 | * | 3/2008 | Blake et al. | 438/5 |
| 2008/0090392 A1 | * | 4/2008 | Singh et al. | 438/514 |

FOREIGN PATENT DOCUMENTS

| | | |
|---|---|---|
| EP | 1278231 A | 1/2003 |
| EP | 1278231 A2 * | 1/2003 |
| EP | 1746182 A | 1/2007 |

* cited by examiner

*Primary Examiner* — Robert Kim
*Assistant Examiner* — Michael Maskell

(57) ABSTRACT

A technique for low-temperature ion implantation is disclosed. In one particular exemplary embodiment, the technique may be realized as an apparatus for low-temperature ion implantation. The apparatus may comprise a pre-chill station located in proximity to an end station in an ion implanter. The apparatus may also comprise a cooling mechanism within the pre-chill station. The apparatus may further comprise a loading assembly coupled to the pre-chill station and the end station. The apparatus may additionally comprise a controller in communication with the loading assembly and the cooling mechanism to coordinate loading a wafer into the pre-chill station, cooling the wafer down to a predetermined temperature range, and loading the cooled wafer into the end station where the cooled wafer undergoes an ion implantation process.

19 Claims, 5 Drawing Sheets

TECHNIQUE FOR LOW-TEMPERATURE ION IMPLANTATION

FIELD OF THE DISCLOSURE

The present disclosure relates generally to semiconductor manufacturing and, more particularly, to a technique for low-temperature ion implantation.

BACKGROUND OF THE DISCLOSURE

With continued miniaturization of semiconductor devices, there has been an increased demand for ultra-shallow junctions. For example, tremendous effort has been devoted to creating better activated, shallower, and more abrupt source-drain extension junctions to meet the needs of modern complementary metal-oxide-semiconductor (CMOS) devices.

To create an abrupt, ultra-shallow junction in a crystalline silicon wafer, for example, an amorphization of the wafer surface is desirable. Generally, a relatively thick amorphous silicon layer is preferred since a thin amorphous layer can cause more significant channeling, fewer dopant atoms confined in the amorphous layer, and more interstitials residing in an end-of-range area beyond the amorphous-crystalline interface. As a result, a thinner amorphous layer may lead to a deeper junction depth, a less abrupt doping profile, an inadequate activation of dopants, and more end-of-range defects after anneal, all of which represent major obstacles in modern CMOS device miniaturization, especially for source-drain extension doping.

It has been discovered that a relatively low wafer temperature during ion implantation is advantageous for amorphization of a silicon wafer. In current applications of ion implantation, wafers are typically cooled during the implantation process by a gas-assisted process using a chiller. In most cases, such cooling techniques put the wafer temperature between the chiller temperature (e.g., 15° C.) and an upper limit imposed to preserve photoresist integrity (e.g., 100° C.). Such a high temperature may enhance a self-annealing effect, i.e., the annihilation of Frenkel pairs (vacancy-interstitial pairs created from ion beam bombardments). Since amorphization of the silicon occurs only when a sufficient number of the silicon atoms are displaced by beam ions, the increase of Frenkel pair annihilation at high temperatures works against the much needed amorphization process, resulting in a higher dose threshold for amorphization and therefore less than ideal shallow junctions.

With other parameters being the same, the thickness of an amorphous silicon layer may increase with decreasing implantation temperature due to a reduction of the self-annealing effect. With a thicker amorphous layer, less tail channeling is expected. More damage created by beam ions is confined in the amorphous region and less damage is introduced into the crystalline region immediately beyond the amorphous-crystalline interface. Also, during a subsequent annealing, a better activation can be achieved as more dopants find themselves in substitutional sites due to a solid-phase epitaxy process.

In addition to the benefits introduced by a thicker amorphous silicon layer, performing ion implantation at low temperatures also minimizes the movement of Frenkel pairs during the implantation. As a result, fewer Frenkel pairs are pushed into the region beyond the amorphous-crystalline interface as compared to the case of higher temperature implantation. Most of the Frenkel pairs will grow back into the lattice during the solid-phase epitaxy process and do not contribute to excess interstitials which cause transient enhanced diffusion or form extended defects. Fewer excess interstitials also lead to less impact of source-drain extension doping on channel or halo doping. With fewer interstitials pushing channel or halo dopants into a channel region, less negative coupling, such as reverse short channel effect, is expected. Thus, better process control and prediction of device performance may be achieved.

Rapid thermal anneals, in which the wafer is heated to, for example, 1000° C. in 5 seconds, have commonly been used to activate implanted dopants. Diffusion-less anneals are becoming preferred post-implant processes, wherein the temperature of a wafer is ramped up much faster (e.g., to 1000° C. in 5 milliseconds) using, for example, a laser as a heat source. These extremely rapid thermal processes act so quickly that the dopants do not have time to diffuse significantly, but there is also less time for the implant damage to be repaired. It is believed that low-temperature ion implantation may improve the extent of implant damage repair during such diffusion-less anneals.

Other reasons for low-temperature ion implantation also exist.

Although low-temperature ion implantation has been attempted, existing approaches suffer from a number of deficiencies. First, most existing low-temperature ion implantation techniques have been developed for batch-wafer ion implanters while the current trend in the semiconductor industry favors single-wafer ion implanters. Batch-wafer ion implanters typically process multiple wafers (batches) housed in a single vacuum chamber. The simultaneous presence of several chilled wafers in the same vacuum chamber, often for an extended period of time, requires extraordinary in-situ cooling capability. Pre-chilling an entire batch of wafers is not an easy option since each wafer will experience a different temperature increase while waiting for its turn to be implanted. In addition, extended exposure of the vacuum chamber to the low-temperature wafers may result in icing from residual moisture.

Second, almost all existing low-temperature ion implanters cool wafers directly during ion implantation. Apart from causing icing problems in a process chamber, direct cooling requires incorporation of cooling components (e.g., coolant pipelines, heat pumps, and additional electrical wirings) into a wafer platen. Usually, modern wafer platens are already fairly sophisticated and very difficult to modify. As a result, modification of an existing ion implanter or designing a new ion implanter to accommodate low-temperature processes can be prohibitively expensive while only managing to achieve marginal improvement. Moreover, modification of a wafer platen for low-temperature ion implantation may have unwanted impact on the ion implanter's capability of performing room temperature ion implantation processes. In addition, in-situ cooling often significantly slows down the overall ion implantation process and therefore reduces production throughput.

In view of the foregoing, it would be desirable to provide a solution for low-temperature ion implantation which overcomes the above-described inadequacies and shortcomings.

SUMMARY OF THE DISCLOSURE

A technique for low-temperature ion implantation is disclosed. In one particular exemplary embodiment, the technique may be realized as an apparatus for low-temperature ion implantation. The apparatus may comprise a pre-chill station located in proximity to an end station in an ion implanter. The apparatus may also comprise a cooling mechanism within the pre-chill station. The apparatus may further comprise a loading assembly coupled to the pre-chill station and the end station. The apparatus may additionally comprise a controller in communication with the loading assembly and the cooling mechanism to coordinate loading a wafer into the pre-chill station, cooling the wafer down to a predetermined temperature range, and loading the cooled wafer into the end station where the cooled wafer undergoes an ion implantation process.

In accordance with other aspects of this particular exemplary embodiment, the pre-chill station may enclose a first vacuum space, and the end station enclosing a second vacuum space separate from the first vacuum space.

In accordance with further aspects of this particular exemplary embodiment, the ion implanter may be a single-wafer ion implanter that processes one wafer at a time in the end station.

In accordance with additional aspects of this particular exemplary embodiment, the controller may be further adapted to cause the loading assembly to remove the wafer from the end station immediately after the ion implantation process.

In accordance with one aspect of this particular exemplary embodiment, the end station may comprise a platen that holds the wafer during the ion implantation process, and wherein the wafer is thermally substantially isolated from the platen. The platen may comprise a plurality of mesa structures that support the wafer, such that total contact area between the platen and the wafer is substantially smaller than the wafer surface. And, the platen may facilitate tilting and rotation of the wafer.

In accordance with another aspect of this particular exemplary embodiment, the pre-chill station may comprise a fixed platen that holds the wafer for cooling. The fixed platen may comprise lift pins to accommodate loading and unloading of the wafer by the loading assembly.

In accordance with yet another aspect of this particular exemplary embodiment, the wafer is attached to an object to achieve a larger thermal mass such that the wafer experiences a smaller temperature increase during the ion implantation process. The object may be a carrier plate that is heavier than the wafer. The wafer may be attached to the carrier plate with carbon dioxide below its sublimation temperature, and the carrier plate may comprise at least one thermal sensor embedded therein. The carrier plate may have embedded therein a cooling/heating mechanism.

In accordance with still another aspect of this particular exemplary embodiment, the ion implantation process may be part of a plasma doping process.

In accordance with a further aspect of this particular exemplary embodiment, the cooling mechanism may cool the wafer based on one or more techniques selected from a group consisting of: gas cooling, coolant circulation, coolant phase change, Peltier heat transfer, and a built-in cryopump.

In accordance with a yet further aspect of this particular exemplary embodiment, an amount of temperature increase due to the ion implantation process may predicted for the wafer, and the controller may be further configured to cause the wafer to be cooled based at least in part on the predicted amount of temperature increase to avoid overheating the wafer during the ion implantation process.

In accordance with a still further aspect of this particular exemplary embodiment, the pre-chill station may be part of a loadlock coupled to the end station. Alternatively, at least part of the pre-chill station and the cooling mechanism may be incorporated into the loading assembly.

In another particular exemplary embodiment, the technique may be realized as a method for low-temperature ion implantation. The method may comprise loading a wafer into a first vacuum space. The method may also comprise cooling the wafer to a predetermined temperature range while the wafer is in the first vacuum space. The method may further comprise loading the cooled wafer to a second vacuum space separate from the first vacuum space. The method may additionally comprise performing an ion implantation process on the cooled wafer in the second vacuum space.

In accordance with other aspects of this particular exemplary embodiment, the method may further comprise attaching a carrier plate to a backside of the wafer to achieve a larger thermal mass such that the wafer experiences an insignificant temperature increase during the ion implantation process.

In accordance with further aspects of this particular exemplary embodiment, the method may further comprise removing the wafer from the second vacuum space immediately after the ion implantation process.

In accordance with additional aspects of this particular exemplary embodiment, the method may further comprise warming up the wafer above a dew point after the ion implantation process.

In accordance with one aspect of this particular exemplary embodiment, the method may further comprise predicting an amount of temperature increase for the wafer due to the ion implantation process and cooling the wafer based at least in part on the predicted amount of temperature increase to avoid overheating the wafer during the ion implantation process.

In accordance with another aspect of this particular exemplary embodiment, the method may further comprise pausing the ion implantation process, re-cooling the wafer to a desired temperature, and resuming the ion implantation process.

In accordance with yet another aspect of this particular exemplary embodiment, the ion implantation process may be part of a plasma doping process.

In accordance with still another aspect of this particular exemplary embodiment, the method may further comprise outgasing the wafer prior to the ion implantation process.

In accordance with a further aspect of this particular exemplary embodiment, the method may further comprise performing a diffusion-less anneal after the ion implantation process.

In yet another particular exemplary embodiment, the technique may be realized as at least one signal embodied in at least one carrier wave for transmitting a computer program of instructions configured to be readable by at least one processor for instructing the at least one processor to execute a computer process for performing the method as recited above.

In still another particular exemplary embodiment, the technique may be realized as at least one processor readable carrier for storing a computer program of instructions configured to be readable by at least one processor for instructing the at least one processor to execute a computer process for performing the method as recited above.

In a further particular exemplary embodiment, the technique may be realized as an ion implanter. The ion implanter may comprise at least one end station, at least one pre-chill station located in proximity to the at least one end station, the at least one pre-chill station having a cooling mechanism, a loading assembly coupled to the at least one end station and the at least one pre-chill station, and a controller configured to cause a wafer to be loaded into the at least one pre-chilled station and cooled to a predetermined temperature range before the wafer is loaded into the end station to undergo an ion implantation process.

In a yet further particular exemplary embodiment, the technique may be realized as a method for ion implantation and dopant activation. The method may comprise performing an ion implantation process on a wafer, wherein, during the ion implantation process, a temperature of the wafer is maintained within a range that is lower than room temperature. The method may also comprise performing a diffusion-less anneal on the wafer after the ion implantation process. Prior to the ion implantation process, the wafer may be pre-chilled to a desired temperature range, and, during the ion implantation process, the wafer may be placed on a platen that is at least partially thermally insulated from the wafer. Alternatively, the temperature of the wafer may be maintained within the range based on one or more techniques selected from a group consisting of: gas cooling, coolant circulation, coolant phase change, Peltier heat transfer, and a built-in cryopump. The diffusion-less anneal may be performed using a laser.

The present disclosure will now be described in more detail with reference to exemplary embodiments thereof as shown in the accompanying drawings. While the present disclosure is described below with reference to exemplary embodiments, it should be understood that the present disclosure is not limited thereto. Those of ordinary skill in the art having access to the teachings herein will recognize additional implementations, modifications, and embodiments, as well as other fields of use, which are within the scope of the present disclosure as described herein, and with respect to which the present disclosure may be of significant utility.

BRIEF DESCRIPTION OF THE DRAWINGS

In order to facilitate a fuller understanding of the present disclosure, reference is now made to the accompanying drawings, in which like elements are referenced with like numerals. These drawings should not be construed as limiting the present disclosure, but are intended to be exemplary only.

DETAILED DESCRIPTION OF EXEMPLARY EMBODIMENTS

Embodiments of the present disclosure provide a technique for low-temperature ion implantation wherein a wafer may be pre-chilled to a desired temperature range before it is loaded onto a platen for ion implantation. During ion implantation, the wafer does not have to be actively or continuously cooled, and it may be thermally insulated from a wafer platen. Wafer temperature increase during ion implantation may be further mitigated by attaching the wafer to another object to achieve a larger thermal mass. The low-temperature ion implantation technique disclosed herein may be implemented for all types of ion implantation processes as well as plasma doping (PLAD) which is also referred to as plasma immersion ion implantation (PIII). Existing ion implanters may be easily modified or new ion implanters may be built to provide the pre-chilling capabilities.

As used herein, "temperature range" refers to a particular temperature value (e.g., −100° C.) or a range of temperature either between two specified temperature points (e.g., −110° C.~−90° C.) or above or below a specified temperature (e.g., ≧−150° C. or ≦80° C.). As used herein, "end station" refers to a part of an ion implanter where a wafer is held during ion implantation. An end station typically includes an ion implantation process chamber, may include, be coupled to, or otherwise be in proximity to a pre-chill station/chamber as will be described in detail below.

Figure 1:
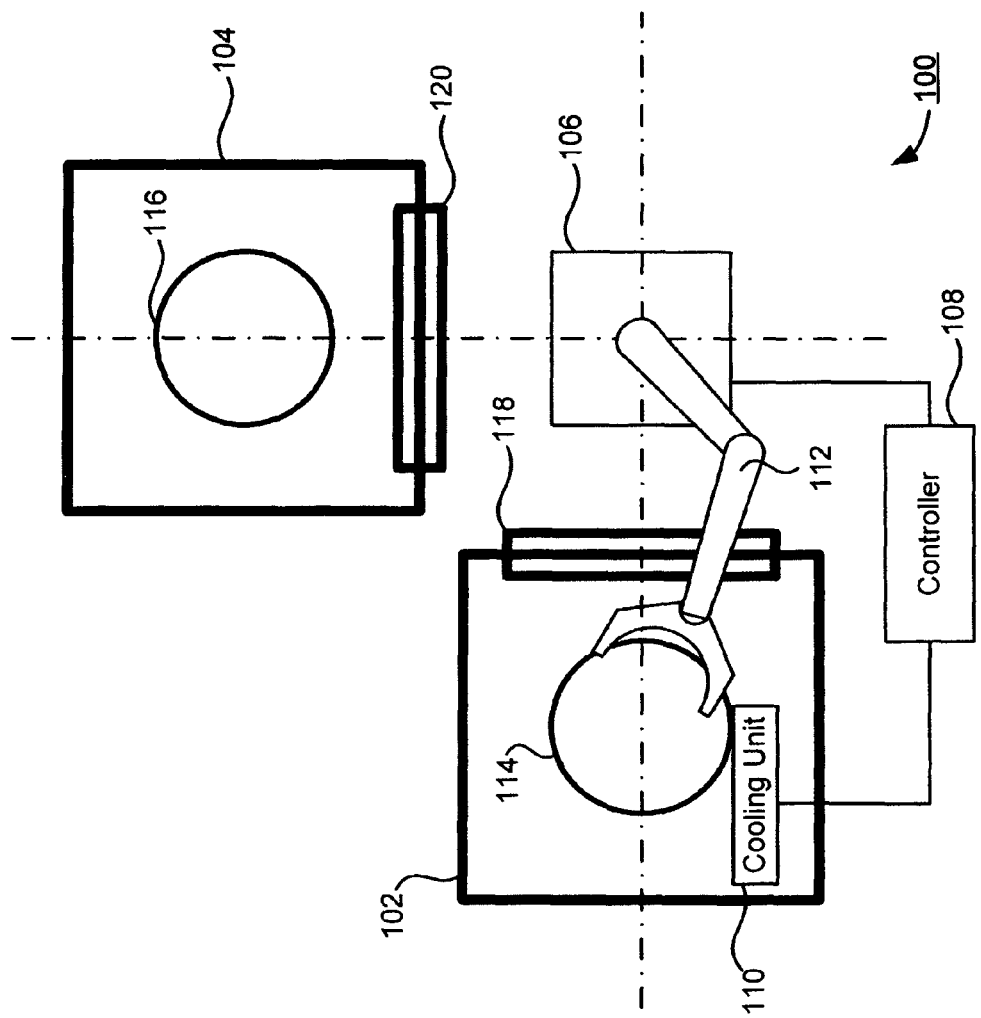
FIG. 1 shows a block diagram illustrating an exemplary system for low-temperature ion implantation in accordance with an embodiment of the present disclosure.

Referring to FIG. 1, there is shown a block diagram illustrating an exemplary system 100 for low-temperature ion implantation in accordance with an embodiment of the present disclosure. The system 100 may be part of an ion implanter and may comprise a pre-chill station 102, an end station 104, a wafer loading assembly 106, and a controller 108.

The pre-chill station 102, also known as a "thermal conditioning unit," may preferably enclose a vacuum space separate from that of the end station 104. Inside the pre-chill station 102 there may be a wafer holder 114 and a cooling unit 110 coupled to the wafer holder 114. The wafer holder 114 is typically a fixed platen that may secure a wafer in place with, for example, an electrostatic force. The cooling unit 110 may employ one or more currently known or later developed cooling techniques to cool a wafer to a predetermined temperature range. Typically, a desired temperature range for low-temperature ion implantation is well below room temperature, and often below the freezing point of pure water. Although the low temperature of liquid nitrogen might be desirable, such an extreme temperature may not be necessary or practicable for all ion implantations. According to one embodiment, a temperature between −100° C. and −50° C. might be sufficient for most applications. Nevertheless, the present disclosure is not limited to any particular temperature range. In fact, the pre-implant thermal conditioning concept can also be applied to ion implantations where the wafer temperature is higher than room temperature.

The end station 104 may be a process chamber where ion implantation of single wafers takes place. The end station 104 may have its own wafer holder 116 that holds and/or moves the wafer during ion implantation. A typical wafer holder 116 may be a platen that facilitates tilting and/or rotation of a wafer. During low-temperature ion implantation, it may not be necessary for a wafer to be actively or continuously cooled by the wafer holder 116. As such, an existing wafer platen need not be modified to accommodate cooling components. In that case, preferably, the wafer holder 116 is thermally insulated from the wafer secured thereon. An electrostatic clamp (ESC or E-chuck) may be used to keep the wafer in place. In addition, a low-contact-area E-chuck may be employed, wherein small mesa structures may support the wafer with minimal contact with the wafer backside (e.g., approximately only one percent of the wafer surface is touched). To further reduce thermal contact between the wafer and the platen, it may be desirable to outgas the wafer before it is loaded for ion implantation.

The wafer loading assembly 106 may comprise a robotic arm 112 adapted to load or unload a wafer in the pre-chill station 102 and the end station 104. The wafer loading assembly 106 may be part of a typical automated wafer handling system. A loadlock 118 and a loadlock 120 may allow access of the robotic arm 112 to the pre-chill station 102 and the end station 104, respectively.

The controller 108 may comprise a microprocessor or microcontroller or similar computing device as well as input/output and storage devices. The controller 108 may be in communication with the cooling unit 110 and the wafer loading assembly 106 to coordinate the loading/unloading and cooling of wafers. Prior to ion implantation of each wafer, the controller 108 may cause the wafer loading assembly 106 to load a wafer onto the wafer holder 114 in the pre-chill station 102. The controller 108 may then instruct the cooling unit 110 to cool the wafer to a predetermined temperature range. When the desired temperature range is reached, the controller 108 may cause the wafer loading assembly 106 to unload the wafer from the pre-chill station 102 and transfer it into the end station 104. That is, the wafer may be placed onto the wafer holder 116 to undergo ion implantation according to a specified recipe. When ion implantation is completed, the controller 108 may cause the wafer to be unloaded from the end station 104.

Figure 2:
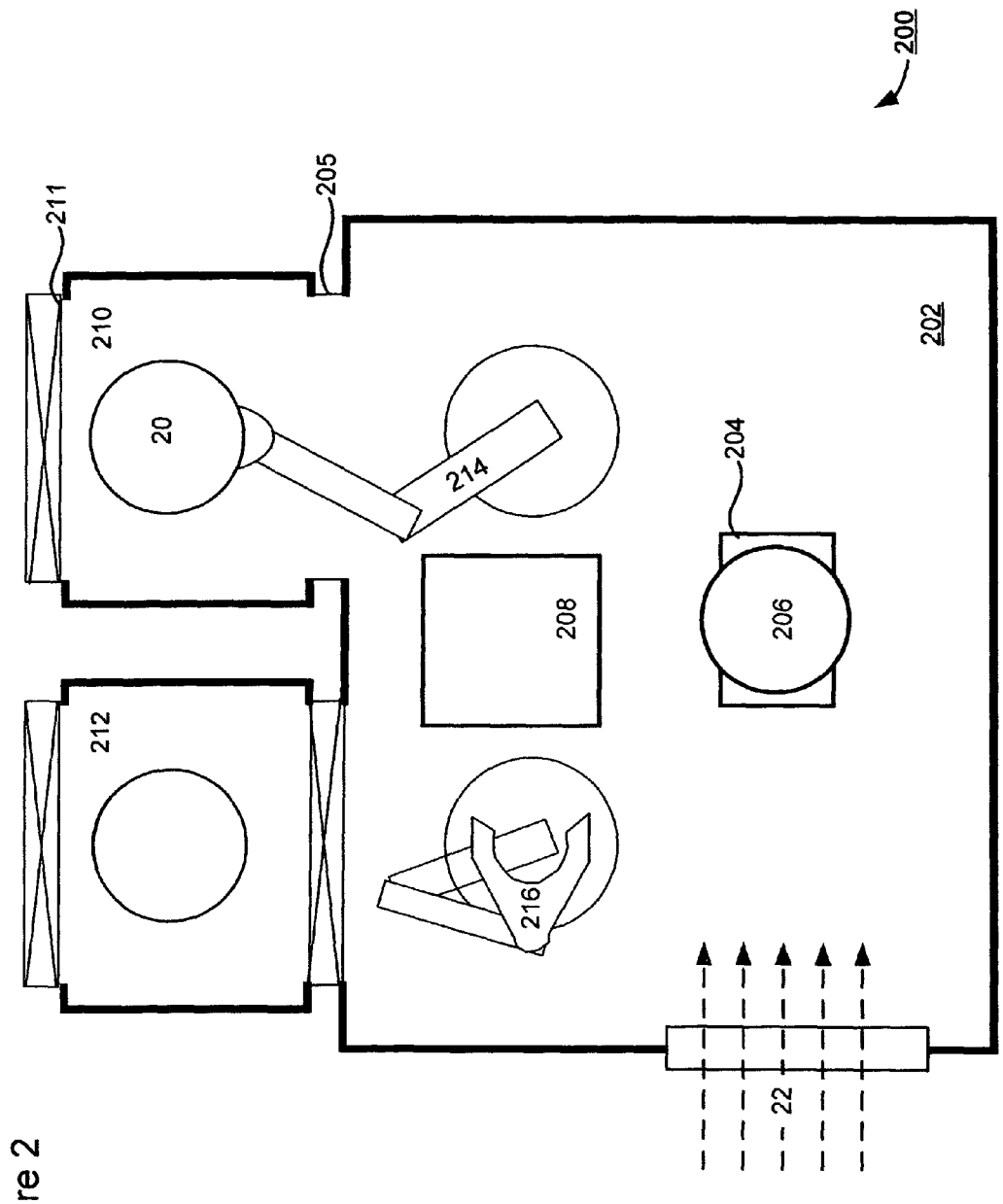
FIG. 2 shows a block diagram illustrating another exemplary system for low-temperature ion implantation in accordance with an embodiment of the present disclosure.

FIG. 2 shows a block diagram illustrating another exemplary system 200 for low-temperature ion implantation in accordance with an embodiment of the present disclosure. This drawing presents an example of how an existing ion implanter may be modified for low-temperature ion implantation.

The system 200 may be based on an end station in an existing ion implanter. The end station may comprise a process chamber 202 and loadlocks 210 and 212. Inside the process chamber 202, there may be a wafer platen 206, a pre-chiller 208, and transfer robots 214 and 216. The wafer platen 206 may hold a wafer during ion implantation, wherein the wafer is substantially thermally insulated from the wafer platen 206.

The pre-chiller 208 may be a component modified from what used to be a wafer orienter. Apart from finding the flat edge, notch, or other distinct features of a wafer, the pre-chiller 208 may now serve an additional purpose of pre-chilling the wafer to a desired temperature range prior to ion implantation. Alternatively, the pre-chiller 208 may only serve the purpose of pre-chilling the wafer, and the wafer orienting function may be relocated to somewhere else in or outside the ion implanter. If a pre-chilled wafer still has to go through an orienter, it may be desirable to thermally insulate such orienter to prevent unwanted temperature increase of the wafer. To minimize icing problems, it may be desirable that the pre-chiller 208 be located in a vacuum space or chamber which is separate from that of the wafer platen 206. The separate vacuum space or chambers may also allow one wafer to be pre-chilled while another wafer undergoes ion implantation at the same time, without undue interferences between the pre-chilling and the ion implantation processes.

In operation, an atmospheric robot (not shown) may introduce a wafer 20 from atmosphere into the loadlock 210 through a vacuum valve 211. Once the loadlock 210 has been evacuated by a pump (not shown), a gate valve 205 leading into the process chamber 202 may be opened. The wafer 20 may be removed by the transfer robot 214 and placed onto the pre-chiller 208. The pre-chiller 208 may cool the wafer 20 to a predetermined temperature range. The pre-chiller 208 may also find the centre of the wafer 20 and its crystal orientation. Once the desired temperature is attained, another transfer robot 216 may load the wafer 20 onto the center of the wafer platen 206, with the crystal lattice of the wafer 20 at a chosen orientation. The wafer platen 206 is shown here in a horizontal load position. At this position, the wafer may be above the height at which an ion beam 22 enters the process chamber 202. Once the wafer platen 206 has been energized to hold the wafer 20, the wafer 20 may be rotated about a horizontal axis perpendicular to the direction of the ion beam 22 by a scanner mechanism 204. The wafer 20 may then be scanned, for example, up and down through the ion beam 22 by the scanner mechanism 204. During the scanning, the wafer 20 may be oriented, for example, vertically, or at another angle between ±60 degrees, depending on the requirements of the ion implant process.

Since in-situ cooling of the wafer is not required during ion implantation, there may be no need to modify the wafer platen 206 for cooling purposes. However, it may be desirable for the wafer platen 206 to be thermally insulated from the wafer to reduce temperature increase of the wafer.

After ion implantation is completed, the transfer robot 216 may unload the wafer 20 and transfer it to the loadlock 212. Depending on residual moisture level in the loadlock 212 as compared to the process chamber 202, it may be desirable to warm up the wafer 20 to some extent before transferring it to the loadlock 212. While in the loadlock 212, the wafer may warm up by itself or through auxiliary heating until its temperature rises above dew point. It may then be safe to open the loadlock 212 to atmosphere and unload the wafer or wafers. Alternatively, a warm-up station may be provided to bring the wafer above dew point after the low-temperature ion implantation process. The warm-up station may be a thermal conditioning unit preferably separate from the pre-chiller 208 although a combined warm-up station/pre-chiller is also possible. Thermal sensors and related electronics may provide feedback control in the warm-up station to ensure that a wafer has been heated up to a desired temperature range. Heating of the wafer may be accomplished in a number of ways, including but not limited to a bank of heating lamps (e.g., infra-red or other electromagnetic frequencies), thermoelectric and/or resistive devices embedded in a platen support of the wafer, and/or circulation of a heated fluid in the wafer support.

According to alternative embodiments of the present disclosure, the pre-chilling process may take place not on a pre-chiller 208 as described above, but in one of the loadlocks. For example, the loadlock 210 may be modified to include or be coupled to a cooling mechanism, such that one or more wafers loaded into the loadlock 210 may be cooled therein before being loaded into the process chamber 202 for ion implantation. In other words, a loadlock may be converted or used as a pre-chill station. In the case of a pre-chiller/loadlock combination, it may also be desirable to include heating capabilities therein in order to warm up a wafer after a low-temperature ion implantation process.

According to an alternative embodiment of the present disclosure, some or all of the pre-chilling and/or post-heating capabilities may be provided with a modified end-effector (or other component) of a transfer robot. In addition, one or more thermal sensors and other control electronics may be provided in association with the cooling/heating mechanism in the transfer robot.

As shown in FIG. 2, only a few modifications to an existing ion implanter may be needed in order to bring about the advantages of low-temperature ion implantation in accordance with the present disclosure.

Figure 3:
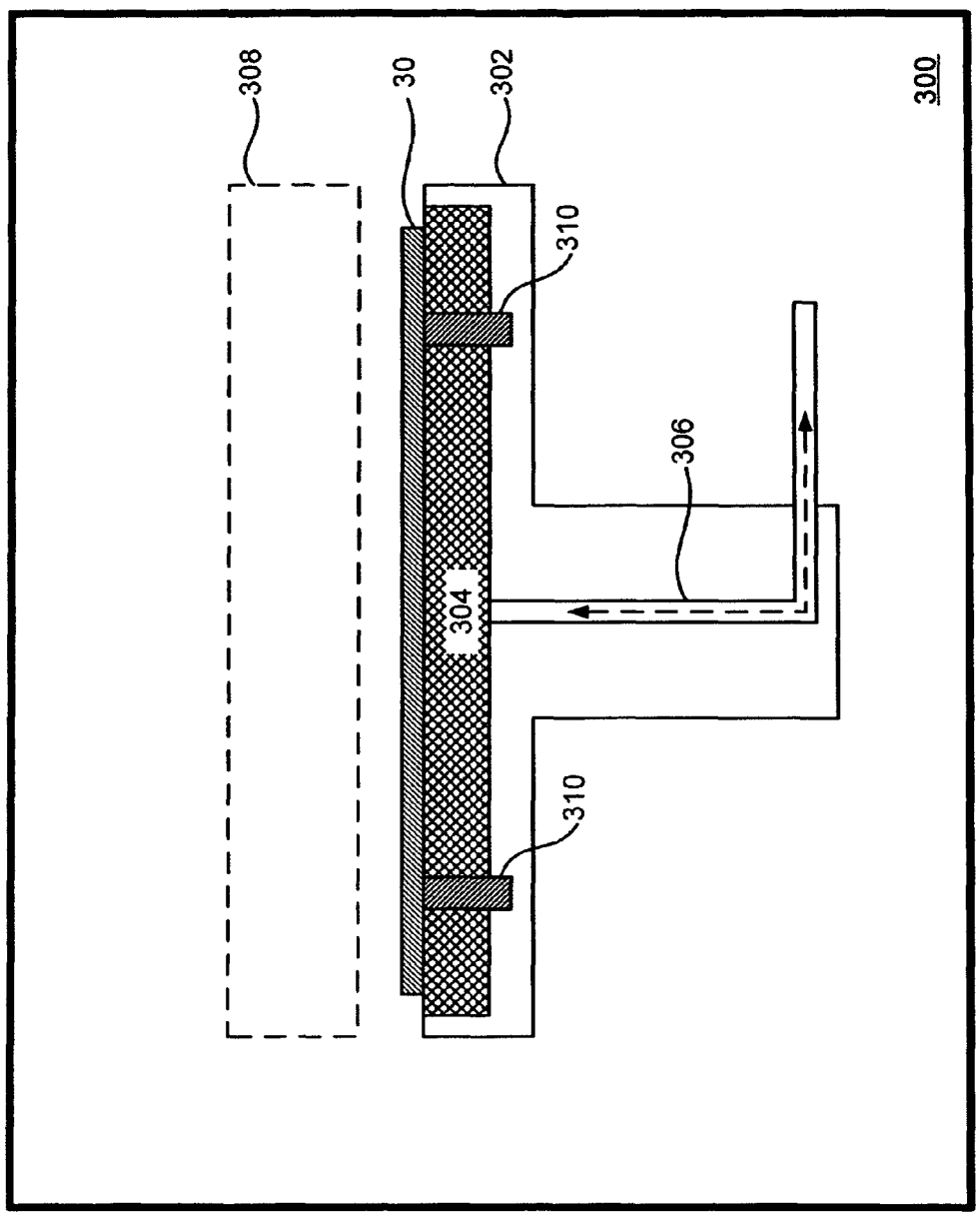
FIG. 3 shows a block diagram illustrating an exemplary pre-chill station for low-temperature ion implantation in accordance with an embodiment of the present disclosure.

FIG. 3 shows a block diagram illustrating an exemplary pre-chill station 300 for low-temperature ion implantation in accordance with an embodiment of the present disclosure. The pre-chill station 300 may comprise a wafer holder 302 that can hold and cool a wafer 30 placed thereon. The wafer holder 302 may be a simple fixed platen as there is typically no need to tilt or rotate the wafer during its pre-chilling process. According to one embodiment, the wafer may be coupled to the wafer holder 302 with a backside gas (e.g., nitrogen). As mentioned above, the pre-chill station 300 may comprise a cooling mechanism that employs any of a number of cooling techniques to bring the wafer 30 to a desired temperature range. For example, a backside cooling assembly 304 may cool the backside of the wafer 30, and/or a front-side cooling assembly 308 may cool the front side of the wafer 30. The backside cooling assembly 304 may provide a heat sink (not specifically shown) in direct contact with the wafer 30 and may circulate coolant (e.g., water, liquid nitrogen) through a pipeline 306. The backside cooling assembly 304 may also take advantage of the phase change of a coolant (e.g., ammonia $NH_3$) to cool the wafer 30 consistently to approximately the same temperature. The backside cooling assembly 304 may also comprise a built-in cryopump (not specifically shown) that directly transfers heat from the backside of the wafer 30. Alternatively, the backside cooling assembly 304 may include an array of (stacked) Peltier devices (not specifically shown) for thermoelectric cooling. The front-side cooling assembly 308 may likewise implement any of a wide variety of cooling techniques to achieve a fast and accurate cooling of the wafer 30.

In addition to cooling capabilities, the wafer holder 302 may also accommodate automatic wafer handling. For example, there may be provided a set of lift pins 310 to keep the wafer 30 in a wafer transfer plane during loading and unloading by robotic arms.

Figure 4:
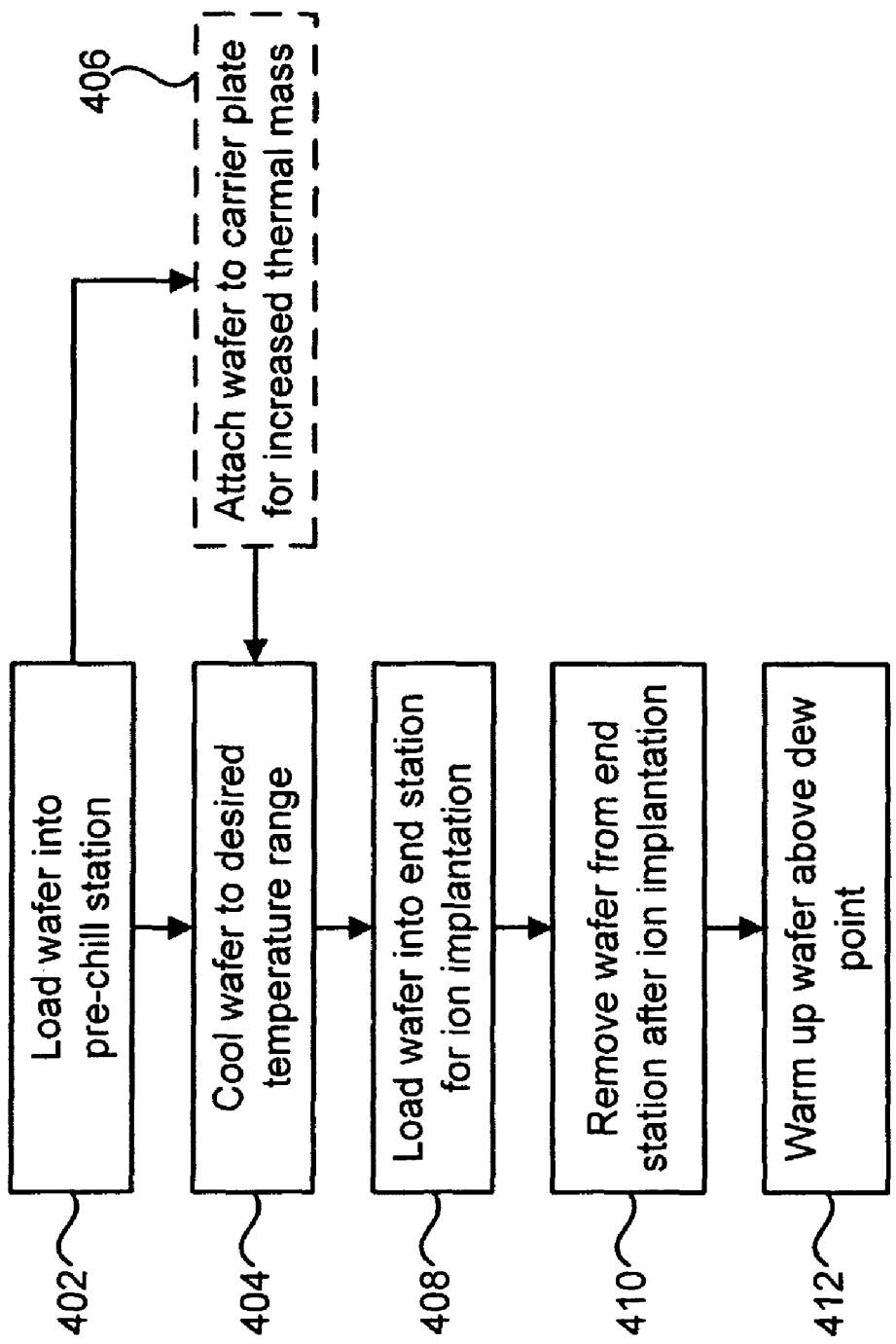
FIG. 4 shows a flow chart illustrating an exemplary method for low-temperature ion implantation in accordance with an embodiment of the present disclosure.

FIG. 4 shows a flow chart illustrating an exemplary method for low-temperature ion implantation in accordance with an embodiment of the present disclosure.

In step 402, a wafer that is about to receive ion implantation may be loaded into a pre-chill station. The pre-chill station may be located in proximity to an end station in an ion implanter. Also, the pre-chill station may preferably have a vacuum space that is separate from that of the end station. According to some embodiments, the wafer may be loaded from a loadlock containing a batch of wafers that may have already been cooled below room temperature to shorten the pre-chilling process in the pre-chill station.

In step 404, the wafer inside the pre-chill station may be cooled to a desired temperature range. As described above, this pre-chilling process may employ any cooling techniques now known or later developed. Since the pre-chilling process does not take place in the end station where ion implantation is eventually performed, there is much less limitation on the selection and implementation of cooling techniques for pre-chilling than in-situ cooling. The pre-chilling process may take 40-60 seconds for ion implantation process that lasts a comparable length of time.

In step 406, the wafer may be optionally attached to another object such as a carrier plate to achieve an increased thermal mass. With both the wafer and the carrier plate at the pre-chilled temperature, it may take a lot more heat transfer from an ion beam to raise the wafer temperature. As a result, any temperature increase of the wafer during ion implantation may be mitigated.

Figure 5A:
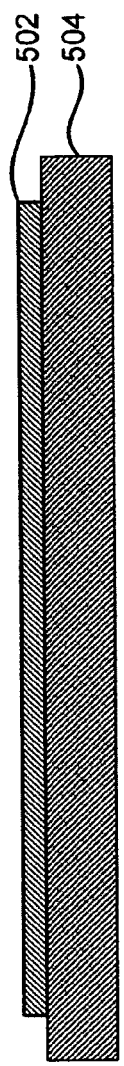
FIGS. 5a and 5b show exemplary wafer attachments for low-temperature ion implantation in accordance with an embodiment of the present disclosure.
Figure 5B:

FIGS. 5a and 5b show exemplary wafer attachments for low-temperature ion implantation in accordance with an embodiment of the present disclosure. FIG. 5a shows a carrier plate 504 being attached to the backside of a wafer 502. The carrier plate 504 may be a metal plate having a heavier mass than the wafer 502 (e.g., 4-5 times the weight of wafer 502). Since part of the heat transferred from the ion beam may be absorbed by the carrier plate 504, the wafer 502 may experience an insignificant temperature increase during ion implantation. The carrier plate may be designed to accommodate electrostatic clamping onto an E-chuck. Accordingly, the carrier plate may comprise a surface material with a suitable conductivity and/or polarizability. For example, a composite metal carrier having a thin layer for clamping and a good conductivity may be appropriate. According to some embodiments, the carrier plate may include embedded heating and/or cooling mechanisms that may be activated when the carrier plate is docked against some electrical contacts.

FIG. 5b shows a wafer 506 with another wafer 508 attached to the backside of the wafer 506. The wafer 508 may be of the same or different type and/or shape as the wafer 506. Preferably, the wafer 508 is at least as heavy as the wafer 506, such that the heat capacity of the wafer 506 is effectively reduced by at least a half.

The attachment between a wafer and another massive object (e.g., a carrier plate or another wafer) may be achieved in a number of ways. According to one embodiment, the backside of the wafer may be clamped to a supporting surface with a chemical compound such as carbon dioxide ($CO_2$). The wafer and its attachment may then be cooled and maintained below the sublimation temperature of $CO_2$ to keep them clamped together. The wafer may later be detached from its attachment by simply allowing it to warm up and pumping away the $CO_2$. Details of this wafer clamping technique may be found in U.S. Pat. No. 6,686,598, which is hereby incorporated herein in its entirety.

According to one embodiment of the present disclosure, a temperature sensor (or thermal sensor) and/or related electronics may be embedded in the wafer attachment (e.g., a carrier plate or another wafer). The temperature sensor may monitor the wafer temperature during the pre-chilling process, during wafer transfer, and/or during ion implantation. The temperature sensor may transmit measurement data through a wired or wireless link to facilitate a feedback control of the pre-chilling process, for example.

In step 408, the pre-chilled wafer (and its attachment, if any) may be loaded into the end station for ion implantation. The end station may be typically a single-wafer process chamber. During ion implantation, the wafer may be thermally insulated from all components in the end station such that the only heat transfer to the wafer comes either from the ion beam or from background radiation. Since ion implantation takes place in a high vacuum, isolation of the wafer may mainly require proper insulation between the wafer and the wafer platen. Even if the insulation between the wafer and the platen is not perfect, any residual thermal conduction between them will be small and often negligible.

The temperature change of the wafer may be monitored, during ion implantation, using, for example, a thermocouple or pyrometer. According to one embodiment, a temperature sensor, preferably a contact-less type, may be installed in the ion implantation process chamber for in-situ temperature monitoring. Alternatively, a temperature sensor may be embedded in a carrier plate to which the wafer is attached. In either case, the temperature measurement data may be communicated to a controller unit via a wired or wireless link. Such temperature measurement data may be used to for feedback control of the ion implantation process. If the wafer temperature rises too quickly, it might become necessary to interrupt the ion implantation process and re-chill the wafer. In that case, one ion implantation recipe may be performed in multiple steps, alternating the chilling and implantation processes. According to one embodiment, a wafer may be pre-chilled to −70° C. and may rise to −50° C. at the end of the ion implantation process.

With a specified ion implantation recipe, it is possible to predict the amount of temperature increase for a particular wafer. Accordingly, the wafer may be pre-chilled to a temperature range based on this prediction, such that the wafer temperature at the end of the ion implantation process may be kept within a tolerable range.

In step 410, the wafer may be immediately removed from the end station upon completion of ion implantation. It may be beneficial to minimize exposure of the end station (and its components) to the low-temperature wafer in order to reduce or avoid icing problems. In addition, to avoid continued heating by the ion beam, it may be desirable to completely block the ion beam from entering the end station after the ion implantation process is completed.

In step 412, the wafer may be warmed up above dew point before it is exposed to atmosphere. The warming up process may be either a passive one, where the wafer slowly warms up by itself, or an active one, where the wafer is heated with a lamp or other heating device. Alternatively, the wafer may be heated up by exposing it to a dry and/or warm gas.

The process as illustrated in FIG. 4 may be divided into a pre-implant stage (e.g., step 404), an ion implantation stage (e.g., step 408), and a post-implant stage (e.g., step 410). According to embodiments of the present disclosure, it may be desirable to maintain wafer temperature within a proper range during each of the three stages. The wafer temperature during the ion implantation stage is typically within a range between approximately $-200°$ C. and $0°$ C. For example, for a particular ion implantation process, the wafer temperature range for the ion implantation stage may be $-100°$ C.~$-70°$ C. An anticipated temperature increase due to ion implantation may be calculated for the wafer, such that a correspondingly lower temperature range may be selected for the pre-implant stage (i.e., pre-chill temperature). The temperature range for the post-implant stage may be selected based on dew point and residual moisture level in various parts of the end station. A typical post-implant wafer temperature range may be $20$~$40°$ C. although a lower range may be suitable for a low dew point. Typically, the ion implantation process chamber is at the highest vacuum and has the lowest humidity level. It may be beneficial to warm up the wafer to some extent before unloading it from the process chamber. According to one embodiment, it may be desirable to provide a post-implant warming station having a comparably low humidity level as the process chamber, such that a cold wafer may be immediately removed from the process chamber after ion implantation. The warming station may then warm up the wafer until it is safe to transfer it to a loadlock for unloading.

According to some embodiments, the above-described and/or any other low-temperature ion implantation techniques may be implemented advantageously in conjunction with diffusion-less anneal processes to achieve the benefits of both rapid dopant activation and improved implant damage repair.

At this point it should be noted that the technique for low-temperature ion implantation in accordance with the present disclosure as described above typically involves the processing of input data and the generation of output data to some extent. This input data processing and output data generation may be implemented in hardware or software. For example, specific electronic components may be employed in an ion implanter or similar or related circuitry for implementing the functions associated with low-temperature ion implantation in accordance with the present disclosure as described above. Alternatively, one or more processors operating in accordance with stored instructions may implement the functions associated with low-temperature ion implantation in accordance with the present disclosure as described above. If such is the case, it is within the scope of the present disclosure that such instructions may be stored on one or more processor readable carriers (e.g., a magnetic disk), or transmitted to one or more processors via one or more signals.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Further, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

The invention claimed is:

1. An apparatus for low-temperature ion implantation, the apparatus comprising:
    a pre-chill station located in proximity to an end station in an ion implanter;
    a cooling mechanism within the pre-chill station configured to cool a wafer from ambient temperature to a predetermined temperature range less than or equal to $-50°$ C.;
    a loading assembly with access to the pre-chill station and the end station; and
    a controller in communication with the loading assembly and the cooling mechanism, the controller configured to coordinate loading the wafer into the pre-chill station, cooling the wafer down to the predetermined temperature range less than or equal to $-50°$ C. before any ion implantation into the wafer, and loading the cooled wafer into the end station where the cooled wafer undergoes an ion implantation process.

2. The apparatus according to claim 1, wherein the pre-chill station encloses a first vacuum space, and the end station enclosing a second vacuum space separate from the first vacuum space.

3. The apparatus according to claim 1, wherein the ion implanter is a single-wafer ion implanter that processes one wafer at a time in the end station.

4. The apparatus according to claim 1, wherein the controller is further adapted to cause the loading assembly to remove the wafer from the end station immediately after the ion implantation process.

5. The apparatus according to claim 1, wherein the end station comprises a platen that holds the wafer during the ion implantation process, and wherein the wafer is thermally substantially isolated from the platen.

6. The apparatus according to claim 5, wherein the platen comprises a plurality of mesa structures that support the wafer, such that total contact area between the platen and the wafer is substantially smaller than the wafer surface.

7. The apparatus according to claim 5, wherein the platen facilitates tilting and rotation of the wafer.

8. The apparatus according to claim 1, wherein the pre-chill station comprises a fixed platen that holds the wafer for cooling.

9. The apparatus according to claim 8, wherein the fixed platen comprises lift pins to accommodate loading and unloading of the wafer by the loading assembly.

10. The apparatus according to claim 1, wherein the wafer is attached to an object to achieve a larger thermal mass such that the wafer experiences a smaller temperature increase during the ion implantation process.

11. The apparatus according to claim 10, wherein the object is a carrier plate that is heavier than the wafer.

12. The apparatus according to claim 11, wherein the wafer is attached to the carrier plate with carbon dioxide below its sublimation temperature.

13. The apparatus according to claim 11, wherein the carrier plate comprises at least one thermal sensor embedded therein.

14. The apparatus according to claim 11, wherein the carrier plate has embedded therein a cooling/heating mechanism.

15. The apparatus according to claim 1, wherein the cooling mechanism cools the wafer based on one or more techniques selected from a group consisting of: gas cooling, coolant circulation, coolant phase change, Peltier heat transfer, and a built-in cryopump.

16. The apparatus according to claim 1, wherein an amount of temperature increase due to the ion implantation process is predicted for the wafer, and wherein the controller is further configured to cause the wafer to be cooled based at least in part on the predicted amount of temperature increase to avoid overheating the wafer during the ion implantation process.

17. The apparatus according to claim 1, wherein the pre-chill station is part of a loadlock coupled to the end station.

18. The apparatus according to claim 1, wherein at least part of the pre-chill station and the cooling mechanism is incorporated into the loading assembly.

19. An ion implanter comprising:
  at least one end station;
  at least one pre-chill station located in proximity to the at least one end station, the at least one pre-chill station having a cooling mechanism configured to cool a wafer from ambient temperature to a predetermined temperature range less than or equal to $-50°$ C.;
  a loading assembly with access to the at least one end station and the at least one pre-chill station; and
  a controller configured to cause the wafer to be loaded into the at least one pre-chilled station and cooled to the predetermined temperature range less than or equal to $-50°$ C. before the wafer is loaded into the end station to undergo any ion implantation process.

* * * * *